US009269460B2

(12) United States Patent
Ong et al.

(10) Patent No.: US 9,269,460 B2
(45) Date of Patent: *Feb. 23, 2016

(54) CONTROLLER TO DETECT MALFUNCTIONING ADDRESS OF MEMORY DEVICE

(71) Applicant: RAMBUS INC., Sunnyvale, CA (US)

(72) Inventors: Adrian E. Ong, Pleasanton, CA (US); Fan Ho, San Ramon, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/840,989

(22) Filed: Aug. 31, 2015

(65) Prior Publication Data

US 2015/0371722 A1  Dec. 24, 2015

Related U.S. Application Data

(63) Continuation of application No. 14/150,659, filed on Jan. 8, 2014, now Pat. No. 9,129,712, which is a continuation of application No. 13/872,947, filed on Apr. 29, 2013, now Pat. No. 8,670,283, which is a (Continued)

(51) Int. Cl.
*G11C 29/00* (2006.01)
*G11C 29/04* (2006.01)

(52) U.S. Cl.
CPC ............ *G11C 29/78* (2013.01); *G11C 29/04* (2013.01); *G11C 29/76* (2013.01)

(58) Field of Classification Search
CPC ......... G11C 29/04; G11C 29/74; G11C 29/76

USPC ........ 365/200, 185.02, 185.09, 201; 714/6.32
See application file for complete search history.

(56) References Cited

U.S. PATENT DOCUMENTS

| 4,428,068 | A | 1/1984 | Baba |
| 4,463,450 | A | 7/1984 | Haeusele |
| 4,630,241 | A | 12/1986 | Kobayashi et al. |
| 4,750,158 | A | 6/1988 | Giebel et al. |
| 5,113,371 | A | 5/1992 | Hamada |
| 5,177,594 | A | 1/1993 | Chance et al. |

(Continued)

FOREIGN PATENT DOCUMENTS

| DE | 10026737 A1 | 12/2001 |
| EP | 0312217 | 4/1989 |

(Continued)

OTHER PUBLICATIONS

EP Communication dated Dec. 4, 2012 in EP Application No. 09730954.6. 4 pages.

(Continued)

*Primary Examiner* — Tan T. Nguyen
(74) *Attorney, Agent, or Firm* — Lowenstein Sandler LLP

(57) ABSTRACT

A controller includes a memory test logic circuit to detect a malfunctioning row of primary data storage elements within an external memory device, an internal memory to store an address corresponding to the malfunctioning row of the external memory device, and a memory setup logic circuit to initiate a repair mode in the external memory device and to end the repair mode in the external memory device. The controller further includes a port to couple to an address line to transmit the address corresponding to the malfunctioning row of the external memory device.

20 Claims, 6 Drawing Sheets

Related U.S. Application Data continuation of application No. 12/922,425, filed as application No. PCT/US2009/040079 on Apr. 9, 2009, now Pat. No. 8,446,788, which is a continuation of application No. 12/082,136, filed on Apr. 9, 2008, now Pat. No. 7,768,847.

(56) References Cited

U.S. PATENT DOCUMENTS

| | | | |
|---|---|---|---|
| 5,258,648 A | 11/1993 | Lin | |
| 5,313,424 A | 5/1994 | Adams et al. | |
| 5,327,013 A | 7/1994 | Moore et al. | |
| 5,355,283 A | 10/1994 | Marrs et al. | |
| 5,357,473 A | 10/1994 | Mizuno et al. | |
| 5,517,515 A | 5/1996 | Spall et al. | |
| 5,574,684 A | 11/1996 | Tomoeda | |
| 5,590,075 A | 12/1996 | Mazzali | |
| 5,602,786 A | 2/1997 | Pascucci et al. | |
| 5,703,400 A | 12/1997 | Wojnarowski et al. | |
| 5,717,245 A | 2/1998 | Pedder | |
| 5,770,477 A | 6/1998 | Brandenburg | |
| 5,812,467 A | 9/1998 | Pascucci | |
| 5,840,417 A | 11/1998 | Bolger | |
| 5,854,534 A | 12/1998 | Beilin et al. | |
| 5,859,804 A | 1/1999 | Hedberg et al. | |
| 5,978,931 A | 11/1999 | Kirihata et al. | |
| 6,022,758 A | 2/2000 | Badehi | |
| 6,031,771 A | 2/2000 | Yiu et al. | |
| 6,052,287 A | 4/2000 | Palmer et al. | |
| 6,141,267 A | 10/2000 | Kirihata et al. | |
| 6,221,753 B1 | 4/2001 | Seyyedy | |
| 6,240,033 B1 | 5/2001 | Yang et al. | |
| 6,414,885 B2 | 7/2002 | Nagamatsu et al. | |
| 6,438,044 B2 | 8/2002 | Fukuda | |
| 6,538,924 B2 | 3/2003 | Dono et al. | |
| 6,643,434 B2 | 11/2003 | Cayrefourcq et al. | |
| 6,868,028 B2 | 3/2005 | Kaiser et al. | |
| 7,028,234 B2 | 4/2006 | Huckaby et al. | |
| 7,053,470 B1 | 5/2006 | Sellers et al. | |
| 7,149,135 B2* | 12/2006 | Okuno | G11C 29/802 365/185.08 |
| 7,162,660 B2 | 1/2007 | Ogino | |
| 7,170,801 B2 | 1/2007 | Lee et al. | |
| 7,221,604 B2 | 5/2007 | Cheng et al. | |
| 7,222,271 B2 | 5/2007 | Ruckerbauer et al. | |
| 7,272,058 B2 | 9/2007 | Murakoshi et al. | |
| 7,359,261 B1 | 4/2008 | Wu et al. | |
| 7,359,262 B2 | 4/2008 | Gotoh | |
| 7,745,920 B2 | 6/2010 | Lee et al. | |
| 7,768,847 B2* | 8/2010 | Ong | G11C 29/802 365/200 |
| 7,937,631 B2 | 5/2011 | Vogelsang | |
| 8,086,913 B2 | 12/2011 | Houg | |
| 8,446,788 B2* | 5/2013 | Ong | G11C 29/802 365/200 |
| 8,670,283 B2* | 3/2014 | Ong | G11C 29/802 365/200 |
| 9,129,712 B2* | 9/2015 | Ong | G11C 29/802 |
| 2003/0107926 A1 | 6/2003 | Ohmura et al. | |
| 2003/0123301 A1 | 7/2003 | Jang et al. | |
| 2003/0147291 A1 | 8/2003 | Kim et al. | |
| 2008/0065929 A1 | 3/2008 | Nadeau-Dostie et al. | |
| 2010/0064186 A1 | 3/2010 | Houg | |
| 2011/0228581 A1 | 9/2011 | Park et al. | |

FOREIGN PATENT DOCUMENTS

| | | |
|---|---|---|
| EP | 1024431 B1 | 8/2000 |
| EP | 1447813 | 8/2004 |
| EP | 1517334 | 3/2005 |

OTHER PUBLICATIONS

EP Communication dated Nov. 23, 2010 re Comments on the Written Opinion and Amendment in EP Application No. 09730954.6. 1 page.
EP Office Action dated Mar. 10, 2015 in EP Application No. 09730954.6. 3 pages.
EP Office Action dated Mar. 3, 2011 in EP Application No. 09730954.6. 3 pages.
EP Response dated Apr. 15, 2013 in EP Application No. 09730954.6, Includes New Description p. 2B. 7 pages.
EP Response dated Jun. 22, 2015 in EP Application No. 09730954.6, Includes New Claims 16 pages.
EP Response dated Sep. 27, 2011 in EP Application No. 09730954.6. 20 pages.
PCT International Search Report and Written Opinion dated Sep. 4, 2009 in International Application No. PCT/US2009/040079. 12 pages.

* cited by examiner

CONTROLLER TO DETECT MALFUNCTIONING ADDRESS OF MEMORY DEVICE

RELATED APPLICATIONS

This application is a continuation of U.S. patent application Ser. No. 14/150,659, filed Jan. 8, 2014, which is a continuation of U.S. patent application Ser. No. 13/872,947, filed Apr. 29, 2013, now U.S. Pat. No. 8,670,283, issued Mar. 11, 2014, which is a continuation of U.S. patent application Ser. No. 12/922,425, filed Sep. 13, 2010, now U.S. Pat. No. 8,446,788, issued May 21, 2013, which is a 371 Application of PCT/US2009/040079, filed Apr. 9, 2009, which is a continuation of U.S. patent application Ser. No. 12/082,136, filed Apr. 9, 2008, now U.S. Pat. No. 7,768,847, issued Aug. 3, 2010, each of which are hereby incorporated by reference herein in their entirety.

BACKGROUND

The present invention relates to semiconductor devices and, in particular, testing and repairing semiconductor memory devices.

A semiconductor device includes one or more integrated circuit (IC) devices, each of which includes many miniaturized circuits implemented in a single semiconductor substrate, commonly referred to as a "chip." The IC devices are typically tested before they are used in order to ensure their proper operation. The IC devices can be tested in a limited fashion using built-in self test (BIST) circuitry that is implemented within the IC devices themselves. A more thorough test of an IC device is traditionally accomplished with complex external testing equipment allowing to input various test patterns, codes, and data, and to stress the circuitry of the IC device.

A common example of an IC device is a memory device implemented on a single chip. The memory device includes multiple data storage elements, each of which is configured to store binary information. Examples of memory devices include random access memory (RAM) devices, such as different DRAM and SRAM devices, read only memory (ROM) devices and other non-volatile memory devices such as FLASH memories. In some memory devices, the data storage elements are individually addressable. For example, they can be arranged in an array of rows and columns, and the stored information can be accessed in a particular element in the array based on that element's row and column addresses.

Typically, the memory device includes primary data storage elements that are intended to be used during normal operation, and redundant data storage elements that are used to replace malfunctioning primary data storage elements. When a memory test finds an erroneous primary data storage element, a repair circuit is configured in the memory device to avoid the malfunctioning storage element and use instead a redundant data storage element. For example, if one or more data storage elements do not properly operate in a row of a primary storage element array, the repair circuit switches to a redundant row of storage elements every time the malfunctioning row is addressed.

In traditional memory devices, the repair circuits include "fuse matching" blocks into which the address of the malfunctioning primary storage elements are permanently "burned." For example, the fuse matching block can include fuses that can be permanently "blown" by laser. Or the fuse matching block can include "anti-fuses" in which selected capacitors can be permanently shorted by high voltage electric pulses to match the erroneous address.

During manufacturing of the chips, variations in the manufacturing processes may cause variations in the device parameters (such as threshold voltage variations and sub-threshold leakage), resulting in "weak" data storage elements that are vulnerable to stress or other external stimuli. Packaging the chips may exaggerate these variations and cause malfunctions in the weak storage elements. After the memory device is packaged, matching a new malfunctioning address by using laser to blow fuses in its repair circuit may be difficult, or even impossible. Although the use of anti-fuses allows a transparent repair process in the packaged device, it involves costly development of anti-fuse technologies. These difficulties can lead to increased manufacturing costs either due to the costly anti-fuse technology or due to the discarding of entire packaged devices for a simple memory failure which can seriously affect the yield of the entire manufacturing process.

For example, a system-in-package (SiP) device includes a memory IC device and an application specific IC (ASIC) device in a single package. Before assembling the SiP device, the memory chip and the ASIC are separately tested. At this stage, errors in the memory chip may be repaired by using laser to permanently blow one or more fuses in the repair circuit. But even if a single bit error happens in the memory chip when it is packaged together with the ASIC, that error cannot be repaired by using the laser to blow the fuses. Thus, the entire SiP device may be required to be discarded even if the ASIC operates perfectly.

SUMMARY

A memory device can be programmed to repair primary data storage elements at power-up or in response to detecting their failure. In one implementation of such programmable memory repair scheme, the memory device includes a repair circuit having address matching registers, where each register can be programmed to identify malfunctioning storage elements. For example, each address matching register can be programmed by using an additional program signal together with existing address lines that are also used for the address matching function of the repair circuit.

In general, in one aspect, the present invention provides a semiconductor memory device that includes a plurality of data storage elements and a repair circuit. The data storage elements include primary data storage elements and one or more redundant data storage elements, the primary data storage elements having respective addresses for memory access operations. The repair circuit is programmable by another semiconductor device separate from the memory device to recognize a malfunctioning address of the primary data storage elements, wherein the repair circuit is configured to reroute memory access from a primary data storage element having the recognized malfunctioning address to a corresponding redundant data storage element.

Particular implementations of the memory device can include one or more of the following features. The repair circuit can include one or more address matching registers that are configured to recognize the malfunctioning address of the primary data storage elements. The primary data storage elements can be organized into primary rows or columns and the redundant data storage elements can form a first redundant row or column, respectively. The address matching registers can be programmable to reroute external access from a malfunctioning primary row or column to the first redundant row or column, respectively. The address matching registers can be programmable to reroute external access from a single malfunctioning primary data storage element to a single one of the redundant data storage elements. The repair circuit can include address lines to receive an address of the memory access operations, and the repair circuit can be further configured to use the address lines for programming the address matching registers. The repair circuit can use the address lines in combination with a set pulse signal to program the address matching registers. The address matching registers can be programmable in a repair mode of the memory device. The repair circuit can include a set pulse generating circuit configured to generate the set pulse signal in the repair mode in response to memory access instructions. The repair mode can be activated in response to a set memory register instruction.

The set pulse generating circuit can be configured to generate the set pulse signal in the repair mode in response to activate, read, and write instructions. The memory device can be packaged, for example, with another semiconductor device in a single package. The other semiconductor device can include an application specific integrated circuit.

In general, in another aspect, the present invention provides a system that includes a memory controller unit and a semiconductor memory device controlled by the memory controller unit to perform memory access operations. The memory device includes a plurality of data storage elements and a repair circuit. The data storage elements include primary data storage elements and one or more redundant data storage elements. The primary data storage elements have respective addresses for the memory access operations. The repair circuit includes one or more address matching registers that are programmable by the memory control unit after powering up the memory device, wherein the programmed address matching registers are configured to recognize a malfunctioning address of the primary data storage elements and the repair circuit is configured to reroute memory access from a primary data storage element having the recognized malfunctioning address to a corresponding redundant data storage element.

Particular implementations of the system can include one or more of the following features. The memory controller unit can be implemented in a first integrated circuit device and the memory device can be implemented in a second integrated circuit device. The memory controller unit can include a non-volatile memory to store repair information about the malfunctioning address. The memory controller unit can be configured to program the address matching registers based on the stored repair information. The memory controller unit can include a memory test function to test the primary data storage elements. The memory controller unit can be configured to program the address matching registers based on a result of the test. The memory control unit and the memory device can be assembled in a single package. The memory control unit can be implemented in an application specific integrated circuit.

In general, in yet another aspect, the present invention provides a method for operating a memory device including primary and redundant data storage elements and a repair circuit with one or more address matching registers. The method includes storing a repair address in a non-volatile memory. The repair address indicates one or more malfunctioning primary data storage elements. The method also includes providing operational power for the memory device, entering into a memory setup mode to prepare the powered memory device for subsequent memory access operations, in the memory setup mode, programming the address matching registers based on the stored repair address, and exiting the memory setup mode to allow the memory device to perform the memory access operations during which the address matching registers are configured to recognize the repair address and the repair circuit is configured to reroute the memory access operations from the primary data storage elements to corresponding ones of the redundant data storage elements if the repair address is recognized.

Particular implementations of the method for operating the memory device can include one or more of the following features. Programming the address matching registers can include entering into a repair mode, providing the repair address to the repair circuit, activating one or more of the address matching registers based on the provided repair address, and exiting the repair mode. Activating one or more of the address matching registers can include activating a first address matching register by a set pulse signal generated in response to a memory access instruction. The memory access instruction can include a read, write or row activate instruction. In the memory setup mode, one or more memory access registers of the memory device can be set to define parameters of the memory access operations. The memory device can be tested to identify the repair address.

In general, in yet another aspect, the present invention provides a method for testing a semiconductor memory device assembled in a single package with a memory controller that is configured to control the memory device for memory access operations. The memory device includes primary and redundant data storage elements and a repair circuit with one or more address matching registers. The method includes testing the memory device in the package, the test identifying one or more malfunctioning primary data storage elements. The method further includes storing a repair address corresponding to the malfunctioning primary data storage elements in a non-volatile memory of the memory controller, and providing a repair unit in the memory controller, the repair unit configured to program the address matching registers of the memory device based on the stored address information in preparation for the memory access operations, wherein the programmed address matching registers are configured to recognize the repair address based on which the repair circuit reroutes the memory access operations from the malfunctioning primary data storage elements to corresponding ones of the redundant data storage elements.

Particular implementations of the method for testing can include one or more of the following features. The memory controller can be implemented in an application specific integrated circuit. The memory device and the memory controller can be separately tested before assembling in the single package. The repair unit can include software stored in the non-volatile memory of the memory controller.

In general, in yet another aspect, the present invention provides a system that includes a first integrated circuit device having a memory setup function, and a second integrated circuit device connected to the first integrated circuit device and including a memory device having a plurality of data storage elements and a repair circuit. The data storage elements include primary data storage elements and one or more redundant data storage elements. The primary data storage elements have respective addresses for memory access operations. The repair circuit is programmable by the memory setup function of the first integrated circuit device after powering up the second integrated circuit, wherein the programmed repair circuit is configured to recognize a malfunctioning address of the primary data storage elements and to reroute memory access from a primary data storage element having the recognized malfunctioning address to a corresponding redundant data storage element.

Particular implementations can include one or more of the following features. The repair circuit can include one or more address matching registers that are programmable by the memory setup function of the first integrated circuit device after powering up the second integrated circuit and the programmed address matching registers are configured to recognize the malfunctioning address of the primary data storage elements. The first and second integrated circuit devices can be assembled in separate integrated circuit packages. The separate packages can be mounted on a single circuit board. The first and second integrated circuit devices can be assembled into a single system-in-package device. The first integrated circuit device can include non-volatile memory storing information about the malfunctioning address which is used by the memory setup function to program the repair circuit in the second integrated circuit.

In general, in yet another aspect, the present invention provides a method for operating a system that includes a first integrated circuit device and a second integrated circuit device operably connected to the first integrated circuit device. The second integrated circuit device includes a memory device having primary and redundant data storage elements. The method includes testing the memory device to identify one or more malfunctioning primary data storage elements, storing at least one repair address corresponding to the malfunctioning primary data storage elements in a non-volatile memory of the first integrated circuit device, and enabling a memory setup function in the first integrated circuit device to program a memory repair circuit in the second integrated circuit device based on the stored repair address in preparation for memory access operations, wherein the programmed memory repair circuit is configured to reroute the memory access operations from the malfunctioning primary data storage elements to corresponding ones of the redundant data storage elements.

Particular implementations can include one or more of the following features. The repair circuit can include one or more address matching registers that are programmable by the memory setup function of the first integrated circuit device after powering up the second integrated circuit and the programmed address matching registers are configured to recognize the repair address. The first and second integrated circuit devices can be assembled in a single system-in-package device.

Particular embodiments can be implemented to realize one or more of the following advantages. By using the programmable address matching registers, malfunctioning storage elements can be repaired in a memory device without the cumbersome process of blowing fuses or anti-fuses. Thus, the storage elements can be repaired without using lasers to blow the fuses or high voltage pulses to short the anti-fuses. The address matching registers can be implemented on the chip in a smaller "real-estate" than that required by the fuses or anti-fuses. The address matching registers can be implemented in accordance with existing memory standards, for example, as vendor specific mode registers. During programming, each of the address matching registers can be selected using the address lines of the primary data storage elements, and a selected register can be set by a simple pulse transmitted through a single programming line. The storage elements can be repaired even after the memory device is packaged. Thus, the manufacturing yield can be increased. In a SiP device, an external tester can identify the malfunctioning addresses. The malfunctioning addresses can be identified using techniques that can access and test the memory thoroughly while in the SiP package without bonding out all the memory pads to the package balls. Such access and test techniques are described in a series of patents originally filed by Inapac Technology, Inc., of San Jose, Calif. (for chip testing within a multi-chip semiconductor package see, e.g., U.S. Pat. Nos. 6,732,304 and 7,139,945; for testing integrated circuit devices see, e.g., U.S. Pat. Nos. 6,754,866 and 7,103,815; for entering test mode and accessing a packaged semiconductor device see, e.g., U.S. Pat. No. 6,812,726; for internally generating patterns for testing in an integrated circuit device see, e.g., U.S. Pat. No. 7,313,740; and for bonding pads for testing of a semiconductor device see, e.g., U.S. Pat. No. 6,882,171—the disclosure of these patents is incorporated herein by reference.) Information identifying the malfunctioning addresses can be stored in a non-volatile memory of the ASIC using standard protocols, such as JTAG. The storage elements can be repaired even after manufacturing, for example, by the customers. Previously found malfunctioning addresses can be stored in a non-volatile memory of a controller which can program those addresses into the address matching registers at power up by a simple modification of the standard memory setup procedure. The address matching registers can also be reprogrammed during normal operation, for example, if a memory test finds malfunctioning data storage elements. In a SiP device, the ASIC can run an internal memory test and program the address matching registers without any external test equipment. The reprogramming can include adding or removing malfunctioning addresses. Once the address matching registers are programmed, the controller can avoid the malfunctioning storage elements without implementing complicated address re-mapping schemes.

Further technical advantages are readily apparent to one skilled in the art from the following figures, descriptions, and claims.

BRIEF DESCRIPTION OF THE DRAWINGS

Like numerals are used for like and corresponding parts in the various drawings.

DETAILED DESCRIPTION

Figure 1:
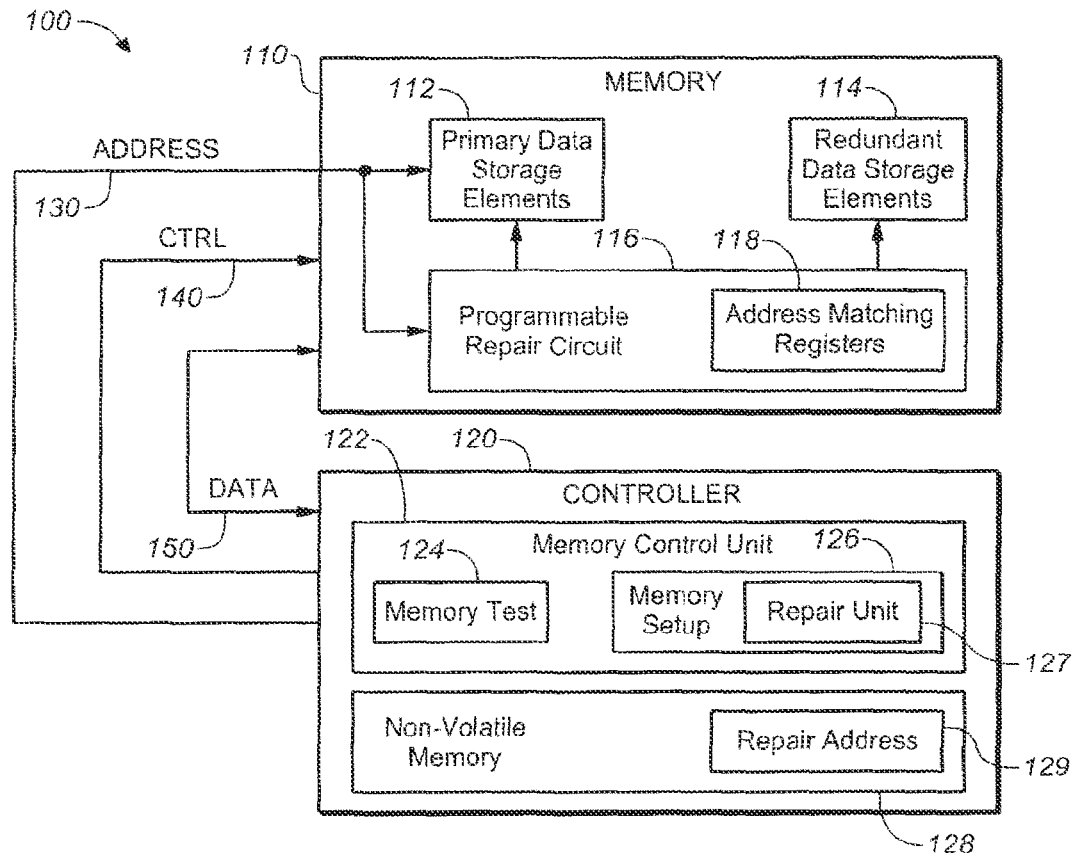
FIG. 1 is a schematic block diagram illustrating a system including a memory device with address matching registers according to one aspect of the invention.

FIG. 1 illustrates an exemplary system 100 according to one aspect of the invention. The system 100 can be operated according to a programmable memory repair scheme which allows repairing malfunctioning storage elements even after the system 100 has been powered up.

The system 100 includes a memory device 110 and a controller 120 connected to the memory device 110. The memory device 110 includes multiple data storage elements and the controller 120 is configured to store data in and read data from those data storage elements using address lines 130, control lines 140, and data lines 150. The memory device 110 and the controller 120 are configured such that the controller 120 can program the memory device 110 to repair one or more of its malfunctioning storage elements. Thus, the memory device can be repaired "on the fly" without permanently blowing fuses or antifuses. Once the memory device 110 is properly programmed to repair all of its malfunctioning storage elements, the controller 120 can control the memory device 110 as if all of its storage elements were fully functional.

In one implementation, the memory device 110 and the controller 120 are implemented in separate chips but assembled in a single package as a SiP device. For example, the memory device 110 can include a DRAM device and the controller 120 can be implemented in an ASIC device and assembled with the DRAM device in a single package. Alternatively, the memory device 110 and the controller 120 can be separately packaged. Or the memory device 110 and the controller 120 can be implemented in a single chip. In other implementations, parts of the memory device 110 and the controller 120 can be distributed on multiple chips as best suited for the corresponding applications.

The memory device 110 includes primary data storage elements 112, redundant data storage elements 114, and a programmable repair circuit 116. The data storage elements 112 and 114 are configured to store binary data. If the memory device 110 has no manufacturing or other errors, it uses only the primary data storage elements 112. The redundant storage elements 114 can be used to replace some of the primary storage elements 112 if they do not operate properly. The repair circuit 116 is programmable to replace a malfunctioning portion of the primary storage elements 112 with the redundant storage elements 114.

The primary storage elements 112 are individually addressable by the controller 120 using the address lines 130. For example, the primary storage elements 112 can be arranged in an array of rows and columns, and the controller 120 can use the address lines 130 to select a particular storage element in a particular row and a particular column. In one implementation, the controller 120 uses the address lines 130 to transmit first a row address to select the particular row and to transmit subsequently a column address to select the particular storage element in the previously selected row. Alternatively, the row and column addresses can be simultaneously transmitted.

The redundant storage elements 114 serve as potential replacement of malfunctioning primary storage elements and, accordingly, typically the memory device 110 includes much less of them than from the primary storage elements 112. The redundant storage elements 114 can be organized to be compatible with the arrangement and addressing protocol of the primary storage elements 112. If the primary storage elements 112 are arranged in an array of rows and columns and addressed in the sequence of row and column, the redundant storage elements 114 can be organized in rows. If a particular storage element is malfunctioning among the primary storage elements 112, the row of the malfunctioning storage element can be replaced by an entire row of the redundant storage elements 114. Alternatively, the redundant storage elements 114 can be organized in columns to replace one or more malfunctioning columns based on their columns address. Or, both of the row and column addresses can be used to select one of the redundant storage elements 114 as replacement of a single malfunctioning primary storage element. In fact, the redundant storage elements can be organized into any other block or other structure as suitable for the particular implementation.

The repair circuit 116 includes address matching registers 118 that the controller 120 can program to recognize addresses that are transmitted through the address lines 130. The programmed address matching registers can be used to match an address of a malfunctioning element among the primary storage elements 112. If the address matching registers 118 indicate that an address includes one or more malfunctioning primary storage elements, the repair circuit 116 disables the primary storage elements 112 and activates the corresponding portion of the redundant storage elements 114. For example, if a particular row includes one or more malfunctioning element in an array of the primary storage elements 112 and the address of the particular row is transmitted through the address lines 130, the address matching registers 118 indicate that, at this row address, the primary storage elements 112 include at least one malfunctioning element, and the repair circuit 116 disables the primary storage elements 112 and activates instead a corresponding row of the redundant storage elements 114.

The address matching registers 118 can be organized according to the structure of the primary storage elements 112 and the addressing protocol used to access those storage elements. If the primary storage elements 112 are organized in separately addressable rows, the address matching registers 118 can be configured to match the row address. If the primary storage elements 112 are organized in separately addressable columns, the address matching registers 118 can be configured to match the column address. If the primary storage elements 112 are organized into multiple banks, the address matching registers 118 can be bank specific. Or the address matching registers 118 can treat the multiple banks as a single unit, without differentiating them.

The controller 120 is configured to control the memory device 110 using the address lines 130, the control lines 140 and the data lines 150. The controller 120 includes a memory control unit 122 and a non-volatile memory 128. The memory control unit 122 directly controls the memory device 110 and the non-volatile memory 128 stores data that are necessary for the operation of the control unit 122. For example, the non-volatile memory 128 stores repair addresses 129 which indicate malfunctioning primary storage elements in the memory device 110. The controller 120 can also include additional functional units as required for a particular application for which the controller 120 is designed. For example, the controller can be implemented in an ASIC device that is packaged together with the memory device 110 according to a SiP design.

The memory control unit 122 includes a memory test function 124 and a memory setup function 126. The memory test function 124 is configured to test the proper operation of the memory device 110 and detect any malfunctions of the primary storage elements 112. The memory test function 124 can also be configured to identify malfunctioning addresses of the primary data storage elements 112, and store the corresponding repair addresses 129 in the non-volatile memory 128. In alternative implementations, the memory control unit 122 can be implemented without the memory test function 124. If testing of the memory device 110 is required in such implementation, it can be performed by using external testing equipment. Based on the test results, the external testing equipment can also provide the repair addresses 129 for storing in the non-volatile memory 128.

The memory setup function 126 prepares the memory device 110 for subsequent normal operation. For example, the memory setup function 126 can setup the structure and timing of the communications through the address and data lines 130 and 150. The memory setup function 126 includes a repair unit 127 which is configured to program the repair circuit 116 of the memory device 110 based on the repair addresses 129 stored in the non-volatile memory 128. During memory setup, the repair unit 127 can use the control lines 140 to put the memory device 110 into or out of a repair mode, the address lines 130 to transmit the repair addresses 129 from the controller 120 to the memory device 110, and the control lines 130 to set the address matching registers 118. In alternative implementations, the repair unit 127 can use any other combination of the address, control and data lines 130, 140 and 150 to program the address matching registers. Furthermore, the repair unit 127 can operate independent of the memory setup unit 126, for example, under the influence of external control.

Once the repair unit 127 has properly programmed the address matching registers 118, the memory control unit 122 can operate normally. Accordingly, the memory control unit 122 does not have to re-map or otherwise try to avoid the repair addresses 129. If a memory operation, such as a memory read or write, involves one of the repair addresses 129, that address is sent to the memory device 110 under the normal protocol of the memory operation. In the memory device, the address is received by the programmable repair circuit 116 which can use the received address and the address matching registers 118 to switch from the primary data storage elements 112 to the redundant data storage elements 114. Thus, the memory device 110 can appear to be fully functional to the controller 120, even though some of its primary storage elements 112 do not properly operate.

Figure 2:
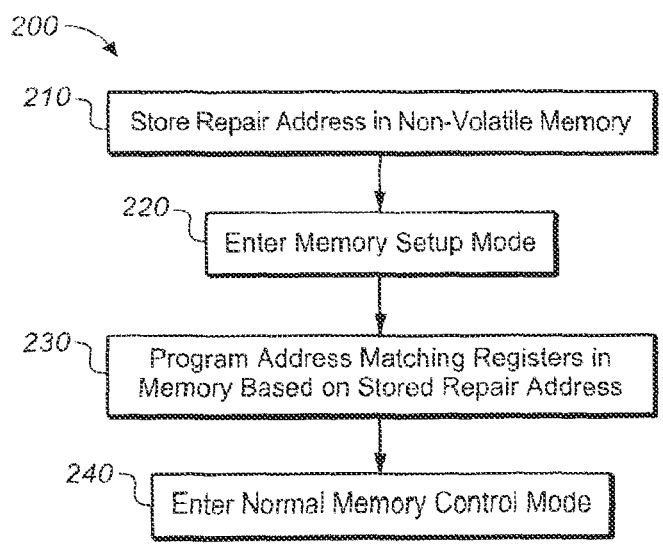
FIGS. 2 and 3 are flowcharts illustrating methods for operating a memory device having address matching registers according to particular aspects of the invention.

FIG. 2 illustrates an exemplary method 200 for controlling a memory device, such as the memory device 110 (FIG. 1), which has a programmable repair circuit with address matching registers. The method 200 can be performed by a controller, such as the controller 120 (FIG. 1), which is connected to the memory device and is configured to operate the memory device under a standard memory access protocol. In one implementation, the method 200 is performed upon power-up. Alternatively or in addition, the method 200 can be performed any time when a memory malfunction is detected.

The controller stores one or more repair addresses in a non-volatile memory (step 210). The repair addresses identify malfunctioning primary data storage elements in the memory device. The repair addresses can be obtained by an internal or external test during manufacture or at a time of power-up or any other time during normal operation.

The controller enters into a memory setup mode (step 220). During the setup, the controller can prepare the memory device for subsequent memory operations and set different registers therein to establish parameters for those operations. For example, the controller can set communication parameters, such as data length and delay for read and write operations.

In the memory setup mode, the controller programs the address matching registers in the memory device based on the repair addresses stored in the non-volatile memory (step 230). As a result of the programming, the address matching registers are configured to recognize addresses that would require access to primary data storage elements that are malfunctioning. If a malfunctioning address is recognized, the repair circuit is configured to switch to the corresponding redundant storage elements.

After completing the memory setup, the controller enters into the normal memory control mode (step 240). In the normal mode, the controller does not need to worry about any malfunctioning address in the memory device. Thus, the controller is not required to remap or otherwise try to avoid the malfunctioning addresses.

In one implementation, the controller is included in an ASIC device that stores each bit of the malfunctioning address. In addition, the ASIC device can store one additional bit, which functions as a "repair flag" to indicate whether memory repair is required or not during the memory setup. If no memory repair is required, the memory controller in the ASIC uses the normal sequence of operations to power up the memory. If memory repair is required, the memory controller can add a memory repair programming sequence after or combined with the normal power-up sequence. Such modular programming allows for an easy implementation of the memory controller, which can use the standard programming sequence for power-up.

Deep Power Down (DPD) is a state in which power (VDD and VDDQ) is continuously applied while all other operations, including clock signal generation, are suspended. When exiting the Deep Power Down mode, the standard power-up sequence can be used without including the memory repair programming sequence. Indeed, as long as the power supply to the memory is not removed, there is no need to repeat the memory repair programming sequence.

Figure 3:
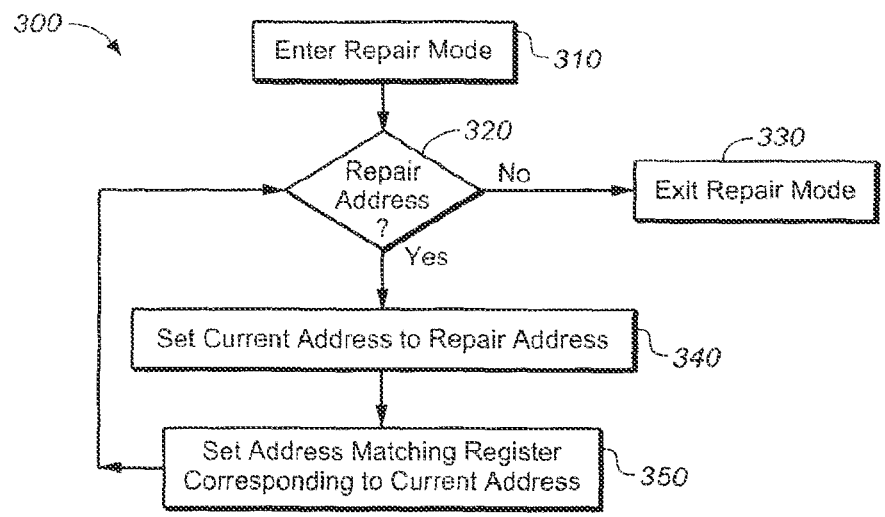

FIG. 3 illustrates an exemplary method 300 for programming address matching registers in a memory device, such as the memory device 110 (FIG. 1). The method 300 can be performed by a controller, such as the controller 120 (FIG. 1), which is connected to the memory device with address and control signal lines, such as the address and control lines 130 and 140 (FIG. 1). In one implementation, the method 300 is performed as a part of the programming step 230 in the memory controlling method 200 (FIG. 2).

The controller enters into a repair mode (step 310). In the repair mode, the controller sends a control signal to the memory device to indicate that subsequent control refers to programming address matching registers in a repair circuit of the memory device.

The controller verifies whether the non-volatile memory stores any malfunctioning addresses to be repaired (decision 320). If no malfunctioning address should be repaired ("NO" branch of decision 320), the controller exits the repair mode and sends a corresponding control signal to the memory device (step 330). If one or more malfunctioning addresses should be repaired ("YES" branch of decision 320), the controller selects a next repair address and transmits the selected repair address through the address lines to the memory device (step 340). In the memory device, the repair circuit enables the address matching registers that correspond to the received repair address, and the controller sets the enabled address matching registers to match that address (step 350).

For example, if the repair address corresponds to a row of the primary storage elements, the controller sets the address lines to transmit the row address (step 340), and subsequently sends an instruction to activate the current row. In the repair mode, the received address enables the corresponding address matching registers, and the row activating instruction generates a pulse to set the enabled registers into their active state (step 350).

After setting the address matching registers of the current address, the controller verifies whether the non-volatile memory stores any more malfunctioning addresses to be repaired (decision 320). If no malfunctioning address is left ("NO" branch of decision 320), the controller exits the repair mode and sends a corresponding control signal to the memory device (step 330). If one or more malfunctioning addresses still should be repaired ("YES" branch of decision 320), the controller sets the current address on the address lines to the next repair address (step 340) and activates the corresponding address matching registers (step 350), until all repair addresses are programmed into the address matching registers of the memory device.

In one implementation, the controller uses a standard memory access protocol to setup the memory device and program its address matching registers. For example, the controller can use memory register set (MRS) instructions, such as user defined MRS instructions, referred here as Inapac MRS (IMRS) instructions, to put the memory device into the repair mode. The controller can also use standard activate (ACT), read (RD), and write (WR) instructions to set the address matching registers in the repair mode. For the memory setup, an exemplary power-up sequence can include the following controller instructions:

<. . . Standard memory setup instructions, such as "PRE" (precharge)>;
<IMRS (putting the memory into repair mode)>;
<Row Address (of the malfunctioning storage element)>;
<ACT (activate row to set the corresponding address matching register>;
<. . . optional other standard memory setup instructions, such as PRE>;
<IMRS (exiting from the repair mode)>;
<standard memory setup . . .
e.g., standard MRS (memory register set) and
EMRS (extended memory register set)>.

In the above example, the controller provides the Row Address on the address lines and sets the address matching register corresponding to the malfunctioning row by the ACT instruction in the repair mode. In addition, the controller can provide a Column Address of the malfunctioning storage element on the address lines and set an address matching register corresponding to that row by a read RD or write WR instruction in the repair mode. Thus, MRS and standard ACT, RD or WR instructions can be used in the repair mode to program the address matching registers. In alternative implementations, any other standard or non-standard protocol can be used to program the address matching registers.

Figure 8:
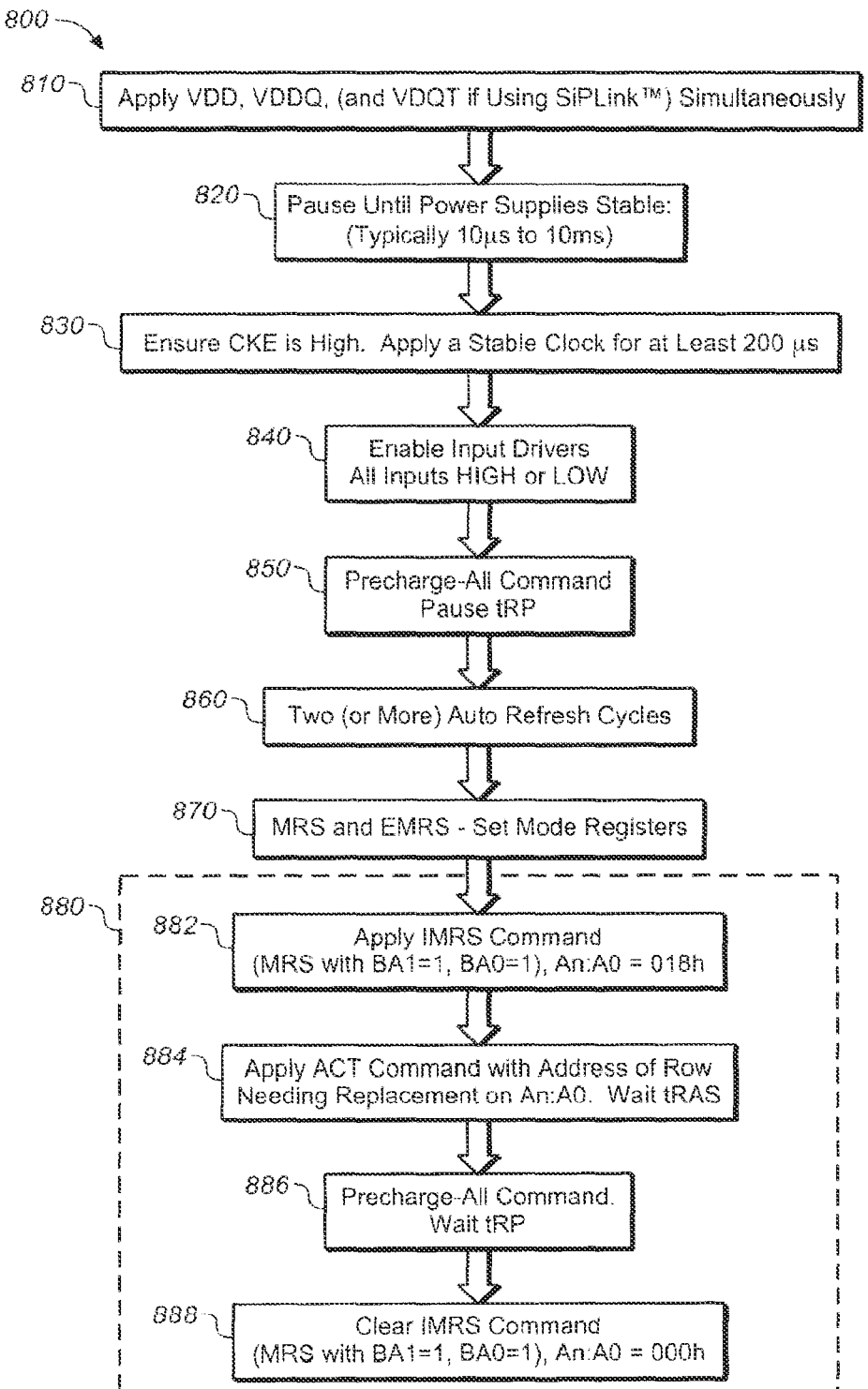
FIG. 8 is a flowchart illustrating an exemplary power up and initialization sequence for the programmable memory repair scheme.
Figure 9:
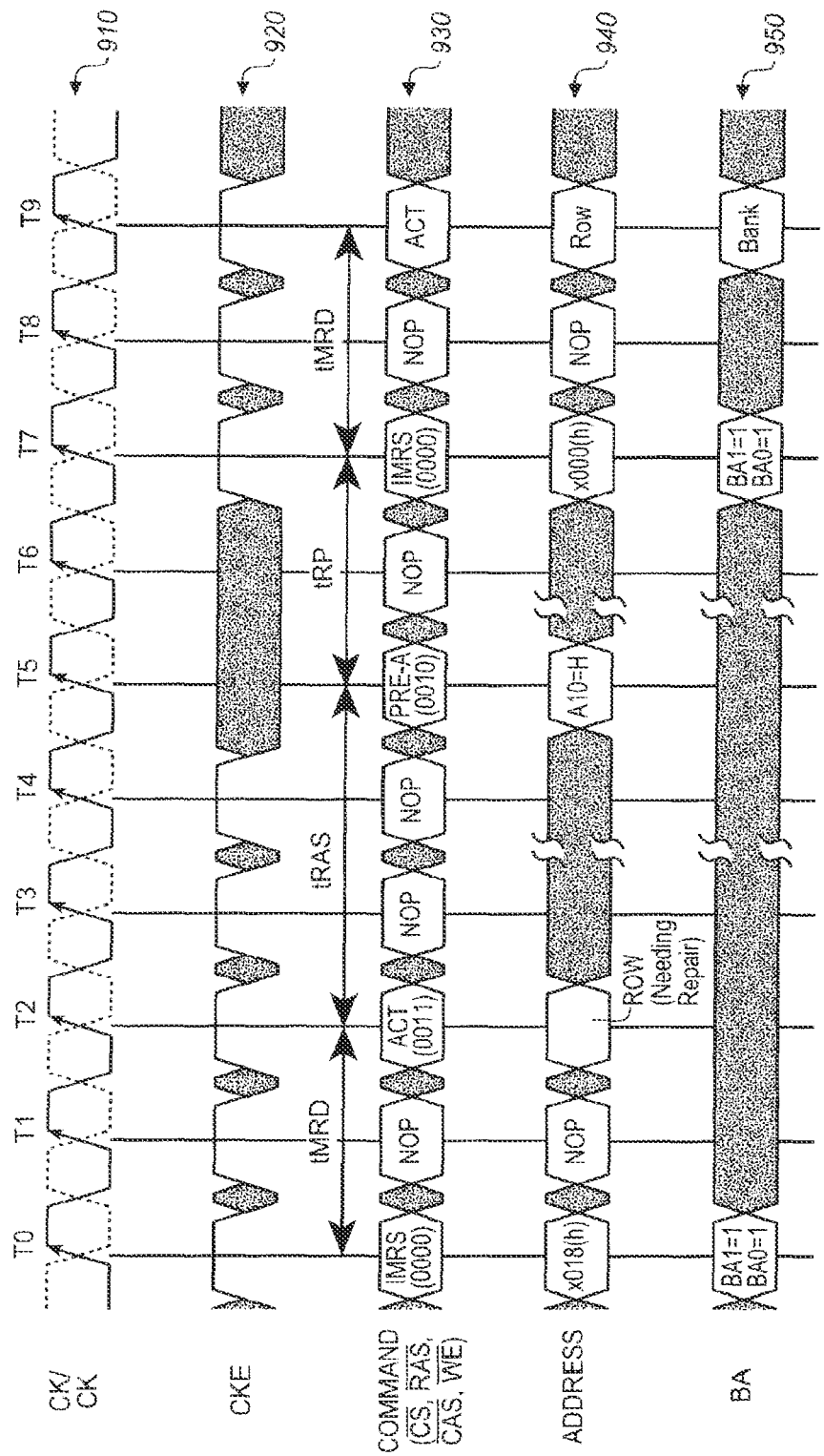
FIG. 9 is a schematic timing diagram illustrating an exemplary implementation of the sequence shown in FIG. 8.

An exemplary power up and initialization sequence for the programmable memory repair scheme is shown in FIG. 8 and FIG. 9 as discussed below in more detail.

Figure 4:
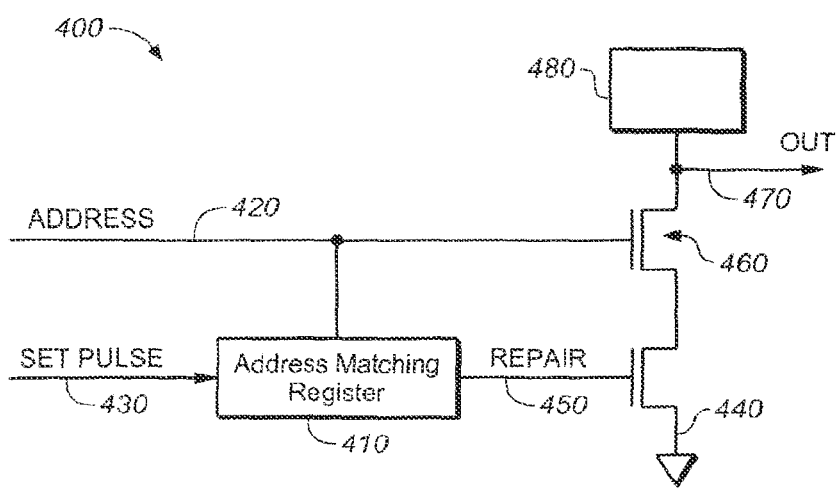
FIG. 4 is a schematic block diagram illustrating an exemplary programmable address matching register according to one aspect of the invention.

FIG. 4 illustrates an exemplary address matching circuit 400. The address matching circuit 400 can be implemented in a memory device, such as the memory device 110 (FIG. 1).

The address matching circuit 400 includes an address matching register 410, a first transistor 440 that is serially coupled with a second transistor 460. Optionally, the address matching circuit 400 also includes some other circuitry, such as circuit element 480, which is required for a particular implementation. The address matching register 410 can be implemented using a latch or any other static memory element, and the first and second transistors 440 and 460 can be replaced with any suitable switching circuit element.

The address matching register 410 receives an address signal 420 and a set pulse signal 430. The address signal 420 enables writing into the address matching register 410 and the set pulse signal 430 is configured to activate the enabled register 410. With a default inactive setting, the address signal 420 and the set pulse signal 430 can be used to program the address matching register 410, for example, in a repair mode discussed above with reference to FIG. 3. Once activated by the set pulse signal 430 during the repair mode, the address matching register 410 remains in the active state until the entire repair circuit 400 is reset.

The address matching register 410 outputs a "repair" signal 450 having an inactive level (corresponding to "0") if the address matching register 410 is not activated, and an active level (corresponding to "1") if the address matching register 410 is activated. The repair signal 450 drives the first transistor 440 and the address signal 420 drives the second transistor 460, which generates an output signal 470. If the address matching register 410 is inactive, the repair signal 450 is also inactive and closes the first transistor 440. As the first transistor 440 is closed, the output signal 470 is independent from the serially coupled second transistor 460, which is driven by the address signal 420. Thus, the output signal 470 is independent of the address signal 420, and does not indicate any address match. On the other hand, if the address matching register 410 is active, the repair signal 450 is also active and opens the first transistor 440. As the first transistor 440 is open, the output signal 470 will depend on whether the serially coupled second transistor 460 is open or closed. As the second transistor 460 is driven by the address signal 420, the output signal 470 will depend on the address signal 420, and indicate if the received address signal 420 is active. Thus, the address matching function of the circuitry 400 is activated.

In one implementation, the primary storage elements are arranged in rows, and each row has a corresponding address matching circuitry 400. In this implementation, the address signal 420 is active only if the corresponding row is selected. Thus, the address matching circuitry 400 matches the address signal 420 by changing the output signal 470, which can be used by further circuitry to disable the corresponding row of the primary storage elements and activate instead a row of redundant storage elements. In alternative implementations, the output of multiple address matching circuitry 400 can be combined by logical operations to match particular repair addresses.

In the implementation shown in FIG. 4, the address matching circuitry 400 requires only one additional signal line, namely that for the set pulse signal 430, compared to prior art implementations which used a laser fuse circuit instead of the address matching register 410. In those prior art implementations, the address signal 420 was used for the address matching functionality, but no set pulse signal 430 was required, as the repair circuit was activated by blowing the laser fuse which, in turn, determined the value of the repair signal 450. In the address matching circuitry 400, the address signal 420 is used not only for the address matching functionality, but also for selecting the address matching register 410 for programming in the repair mode. Thus, programming the address matching register 410 can be implemented by adding to the prior art designs only one additional signal line, that for the set pulse signal 430. In alternative implementations, the address matching register 410 can receive any other additional signals, for example, signals for selectively reset circuit elements.

Figure 5:
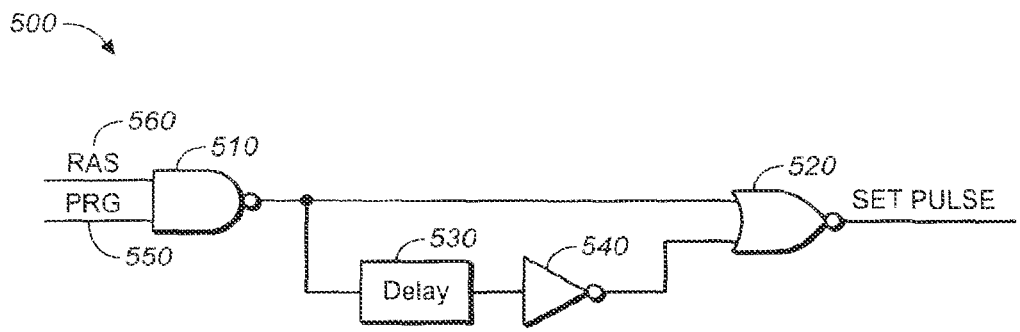
FIG. 5 is a schematic block diagram illustrating an exemplary circuit for generating a set pulse for an address matching register according to one aspect of the invention.

FIG. 5 illustrates an exemplary pulse generating circuit 500 that can be used to generate a set pulse for an address matching register of a memory device which is programmed during a repair mode, as discussed above with reference to FIGS. 1-4.

The pulse generating circuit 500 includes a NAND gate 510 which is connected to a NOR gate 520 using two paths, one direct path and another through a delay element 530 and an inverter 540. The NAND gate receives a PRG signal 550 and a RAS signal 560. The PRG signal's active value indicates that the memory device is in the repair mode, and programming the address matching registers is enabled. In contrast, if the PRG signal is inactive, the output of the NAND gate remains at an active level "1" which, in turn, sets the output of the NOR gate 520 to an inactive level "0". In the present example, the RAS signal 560 is a row activating signal. Instead of the RAS signal 560, alternative implementations can use any other signal which can be controlled from a controller and thus allow programming the address matching registers. For example, the controller can send ACT, RD, or WR instructions to the memory device in the repair mode and, instead of the RAS signal 560, the pulse generating circuit 500 can use internal signals derived from those instructions.

In the repair mode, the PRG signal 550 is active and the NAND gate's output depends on the RAS signal 560. If the RAS signal 560 is activated, the output of the NAND gate 510 transitions to a low level ("0") from its prior high level ("1"). The NOR gate 520 receives this transition to low signal level, on one hand, directly and, on the other hand, through the delay element 530 and the inverter 540 which delay and reverse the transition, which accordingly goes to high level from its prior low. Due to the delay, low signal levels overlap at the two input of the NOR gate 520 for a short time. For that short time, the output of the NOR gate 520 goes high. After the delay, the inverter 540 drives one of the NOR gate's input high, and accordingly its output low. Thus, the circuit 500 generates a short pulse which can be used to program the address matching registers.

Figure 6:
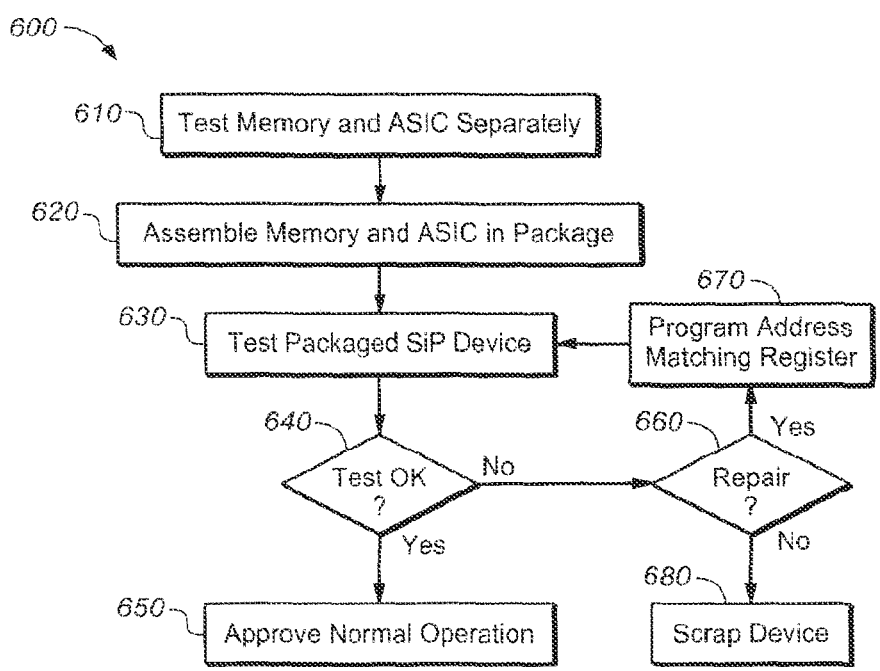
FIG. 6 is a flowchart illustrating an exemplary method for testing SiP devices according to one aspect of the invention.

FIG. 6 illustrates a method 600 implemented by a system for testing and programming SiP devices that include an ASIC and a memory device in a single package. The memory device has programmable address matching registers, and the ASIC is configured to program and control the memory device as discussed above.

The system tests the memory and ASIC devices separately (step 610). After passing the separate tests, the memory device and the ASIC are assembled in a single package (step 620). After the assembly, the system tests the memory device and the ASIC within the package (step 630), and checks whether the test results are acceptable (decision 640). If both the ASIC and the memory device pass the test ("YES" branch of decision 640), the system approves the packaged SiP device for normal operation (step 650). If either element of the packaged device fails the test ("NO" branch of decision 640), the system verifies whether the packaged device can be repaired (decision 660). If the ASIC has failed or the memory device cannot be repaired by programming its address matching registers ("NO" branch of decision 660), the system discards the packaged device (step 680). If the ASIC has passed the test and the memory device has address matching registers available for the repair ("YES" branch of decision 660), the system programs the address matching registers of the memory device based on the malfunctioning address to be repaired (step 670). Optionally, the system can store the repair address into a non-volatile memory of the ASIC.

After the repair, the system performs a new memory test (step 630), and verifies whether the repaired memory has passed. If it has ("YES" branch of decision 640), the system approves its normal operation (step 650). The repair addresses can be stored in the non-volatile memory of the ASIC at this point (if it was not stored before), or the system can store the repair addresses in a document or software shipped with the package device. If the repair of the memory did not work ("NO" branch of decision 640), the system judges again whether another repair is possible (decision 660), and if the memory cannot be repaired ("NO" branch of decision 660), the system discards the entire packaged device (step 680).

The method 600 can be used to increase yield during manufacturing, because it allows simple repairs of the memory device even after packaging the ASIC and the memory device together. The increase of the yield is possible, because the packaging causes failure typically only in a few primary data storage elements, which can be repaired with the techniques discussed above. Furthermore, increasing the yield even by only a few percent is important for SiP devices, which would be otherwise discarded even though their ASIC is fully functional and their memory has only a few failing storage elements.

Figure 7:
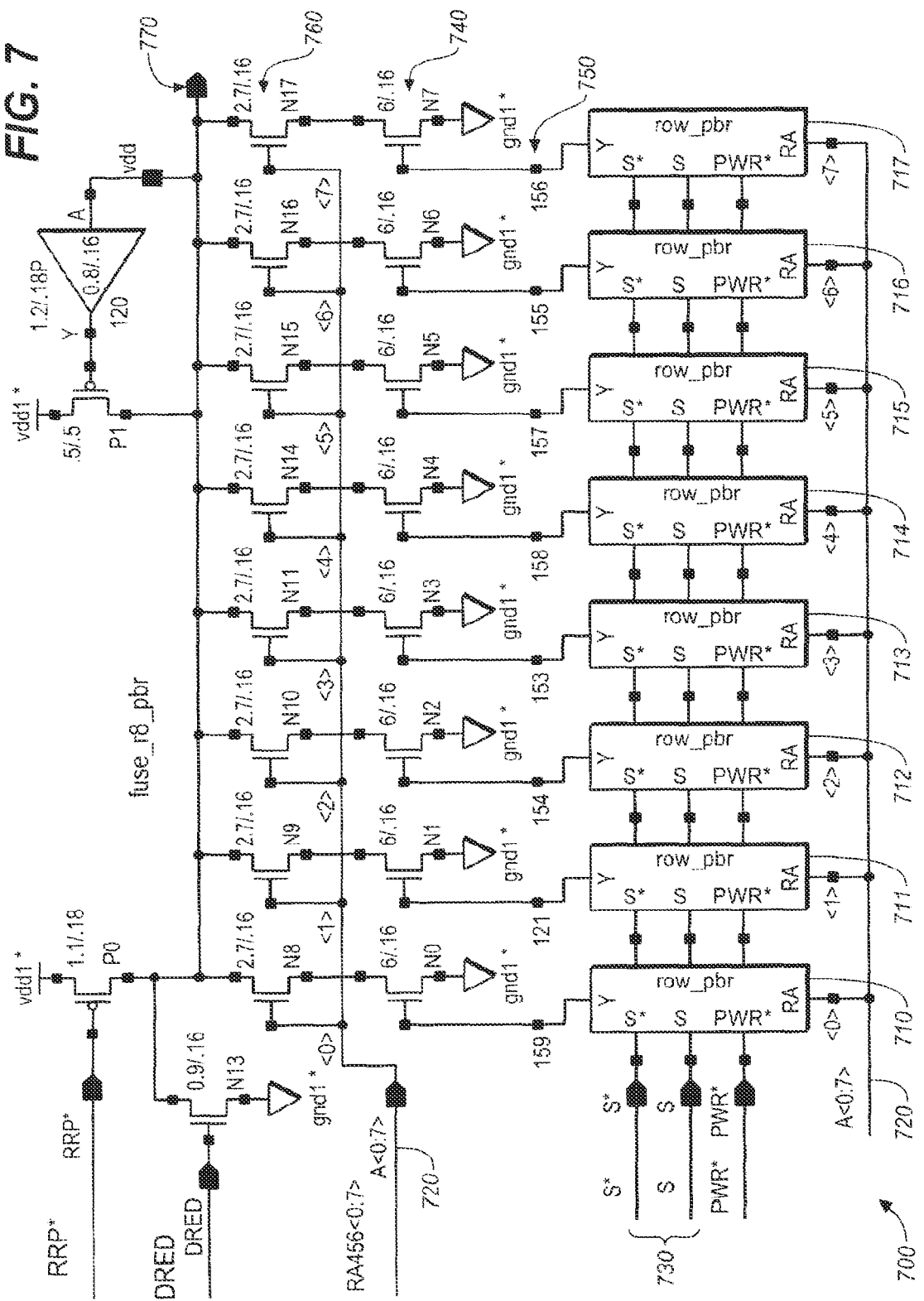
FIG. 7 is a schematic block diagram illustrating an exemplary address matching circuit using multiple programmable address matching registers.

FIG. 7 illustrates an exemplary implementation of an address matching circuit 700 that can be implemented in a memory device, such as the memory device 110 (FIG. 1).

The address matching circuit 700 includes multiple address matching registers 710, 711, . . . , and 717. Each of the address matching registers 710-717 receives a respective component <0>, <1>, . . . or <7> of an address signal 720 (also labeled as A<0:7>) which can be, for example, a row address or a column address. The components A<0:7> of the address signal 720 can be used to select one of the registers 710-717 for programming in the repair mode. The selected register can be activated by a set pulse signal 730, which is received in the address matching circuit 700 through differential signal lines S and S*. In one implementation, the differential signal lines S and S* are driven by a single input line from which the differential signal components S and S* are derived using direct and inverted connections. After the setup pulse signal 730 is received, the programmed register actives a corresponding one of repair signal 750s and, in turn, the activated repair signal 750 drives a respective one of repair transistors 740 (also labeled as N0-N7).

The same components A<0:7> of the address signal 720 are also received by respective address matching transistors 760 (also labeled as N8-N11 and N14-N17). The address matching transistors 760, in combination with the repair transistors 740, generate an address matching output 770 based on the address signal 720 and the repair signals 750 generated by the programmed address matching registers 710-717. Thus, the same address signals 720 can be used for programming the registers 710-717 in the repair mode, and for matching addresses during normal operation. Accordingly, only one set of addressing lines are required, and only the set pulse signal 730 needs to be added for programming the registers 710-717.

If the address signal 720 is a row address, the address matching output 700 can be used to activate a redundant row when one of the row addresses A<0:7> point to a malfunctioning row of the primary data storage elements. Thus, the malfunctioning row can be repaired "on the fly" without the need of blowing fuses (or antifuses). In alternative implementations, the address matching registers 710-717 can be implemented for matching a column address. By using appropriate logical combinations and operations, the address matching registers 710-717 can be used for any other addressing scheme.

FIG. 8 illustrates an exemplary method 800 for powering up and initializing a memory device, such as a DRAM device, in accordance with an exemplary implementation of the programmable memory repair scheme. For example, the method 800 can be performed by the system 100 that includes the controller 120 (FIG. 1) to power up and initialize the memory device 110 (FIG. 1).

The system applies power, such as VDD and VDDQ, simultaneously to the memory device (step 810). If the system uses SiPLink™ technology, the system can apply VDQT as well. After pausing for a short time (from about 10 μs to about 10 ms) to allow the power supply to stabilize (step 820), the system enables the clock and applies a stable clock signal to the memory device for at least 200 μs (step 830). The system enables input drivers of the memory device and sets all inputs to the same logical level (HIGH or LOW) (step 840). The system applies a Precharge-All command to the memory device and pauses for a predetermined precharge time period tRP (step 850). After applying two or more Auto Refresh cycles (step 860), the system sets registers in the memory device using standard MRS and EMRS commands (step 870).

After setting the standard registers, the system programs the address matching registers in the memory device to repair a malfunctioning row (step 880). During the repair phase, the system first applies an Inapac Mode Register Set (IMRS) command to have the memory device enter into the repair mode (step 882). Next, the system applies to the memory device an ACT command with an address of the malfunctioning row that needs to be replaced with a redundant row and waits for a predetermined row-active time period tRAS (step 884). The system applies again a Precharge-All command to the memory device and pauses for the corresponding predetermined precharge time period tRP (step 886). The system then applies another IMRS command to have the memory device quit from the repair mode (step 888).

FIG. 9 illustrates an exemplary timing diagram 900 for implementing the programmable memory repair scheme using the Inapac Mode Register Set (IMRS) command as discussed above with reference to FIG. 8. The timing diagram 900 illustrates the detailed timing of multiple input signals that are received by the memory device during the initialization method 800. These input signals include a clock signal (CK) 910, a clock enable signal (CKE) 920, command signals (CS, RAS, CAS, WE) 930, address signals 940 and bank selection signal (BA) 950.

Although the present invention and its advantages have been described with reference to particular implementations, it should be understood that various changes, substitutions, and alterations can be made therein without departing from the spirit and scope of the invention as defined by the appended claims. For example, although particular semiconductor devices and device packages have been discussed, the described techniques can be used for other devices and device packages; or steps in the described methods can be performed in different order and still provide desirable results. Thus, the described techniques are not limited to SiP devices, and can be implemented in, for example, package-on-package (PoP) or package-in-package (PiP) structures, single in-line memory modules (SIMMs), IC boards, personal computers, network servers, or any other device structure. The described techniques or portions of them can be implemented in software, hardware, or a combination of software and hardware. For example, some method steps or functional elements can be implemented in firmware, while others can be "hardwired." Furthermore, the techniques which are described in detail with reference to a particular structure, such as rows of data storage elements, can also be applied to other arrangements, for example, to columns. Also, the techniques of the present invention can be combined with prior art techniques. For example, the programmable registers of the present inventions can be combined with prior techniques such as those using laser fuses or anti fuses. In particular implementations, such combinations can provide additional advantages. For example, the laser fuses can be used to repair primary data storage elements before packaging, and the programmable registers can be used for repair after packaging. Such variations can be implemented with few modifications or additional elements. For example, a flag can be added to indicate whether the laser fuse bank or the programmable registers are used to activate certain redundant data storage elements, and the flag can be stored in a laser fuse ID circuit which identifies the fuses with a laser fuse ID tag, such as a 40-bit tag. The fuse ID information can be read from the laser fuse ID circuit, for example, in the test mode (Read Fuse ID mode) using designated test data lines or multiplexed pins. Alternatively, the flag can be incorporated in the laser fuse bank.

Thus, the discussion included in this application is intended to serve as a basic description. It should be understood that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure as it would be understood by a skilled artisan. Where the invention is described in device-oriented terminology, each element of the device implicitly performs a function. Neither the description nor the terminology is intended to limit the scope of the claims.

What is claimed is:

1. A controller comprising:
   an internal memory to store an address; and
   a memory control unit operatively coupled with the internal memory, the memory control unit comprising a memory test logic circuit to detect a malfunctioning row of primary data storage elements within an external memory device, the external memory device being another semiconductor device separate from the controller, the memory test logic circuit to store the address in the internal memory, the address indicating the malfunctioning row of primary data storage elements, wherein the memory control unit further comprises a memory setup logic circuit.

2. The controller of claim 1, wherein the controller to program the external memory device to repair the malfunctioning row of primary data storage elements within the external memory device using the address in the internal memory.

3. The controller of claim 2, wherein the memory setup logic circuit to prepare the external memory device for normal operation subsequent to the repair.

4. The controller of claim 1, wherein the memory setup logic circuit comprises a repair unit to program a repair circuit of the external memory device based on the address stored in the internal memory.

5. The controller of claim 4, further comprising:
   a control line port to receive a control line, wherein the repair unit to use the control line to put the external memory device into or out of a repair mode.

6. The controller of claim 5, further comprising:
   an address line port to couple to an address line; and
   a data line port to couple to a data line, wherein the repair unit to use the address line to transmit the address from the controller to the memory device and wherein the repair unit further to use the control line to set address matching registers in the memory device.

7. The controller of claim 1, wherein the controller is implemented in an application specific integrated circuit.

8. A controller comprising:
   a memory test logic circuit to detect a malfunctioning row of primary data storage elements within an external memory device;
   an internal memory to store an address corresponding to the malfunctioning row of the external memory device;
   a memory setup logic circuit to initiate a repair mode in the external memory device and to end the repair mode in the external memory device; and a port to couple to an address line to transmit the address corresponding to the malfunctioning row of the external memory device.

9. The controller of claim 8, wherein the memory setup logic circuit to program the external memory device to repair the malfunctioning row of the primary data storage elements using the address stored in the internal memory.

10. The controller of claim 8, wherein the memory setup logic circuit to send an indication of the end of the repair mode to the external memory device using the port.

11. The controller of claim 8, further comprising:
a control line port to couple to a control line, wherein the memory setup logic circuit to use the control line to initiate and to end the repair mode in the external memory device.

12. The controller of claim 8, wherein memory setup logic circuit to write the address over the address line into an address mapping register in the external memory device.

13. The controller of claim 8, wherein an indication of the malfunctioning row is received from external test equipment.

14. The controller of claim 8, wherein the controller and the external memory device are packaged together within an application specific integrated circuit.

15. A method comprising:
transmitting, by a controller, to an external memory device:
a first memory register setting command to initiate a repair mode in the external memory device;
an indication of a malfunctioning row of primary data storage elements within the external memory device, wherein an address corresponding to the malfunctioning row is stored in an internal memory of the controller;
a row precharge command; and
a second memory register setting command to end the repair mode in the external memory device.

16. The method of claim 15, further comprising:
detecting the malfunctioning row of primary data storage elements within the external memory device.

17. The method of claim 15, further comprising:
enabling a memory setup logic circuit in the controller to program a memory repair circuit in the external memory device based on the address stored in the internal memory of the controller.

18. The method of claim 15, further comprising:
programming the external memory device to repair the malfunctioning row of the primary data storage elements using the address stored in the internal memory of the controller.

19. The method of claim 15, wherein the controller is implemented in an application specific integrated circuit.

20. The method of claim 15, wherein the second memory register setting command further initiates a normal operation mode in the external memory device.

* * * * *